United States Patent
Jou et al.

(10) Patent No.: US 10,591,687 B2
(45) Date of Patent: Mar. 17, 2020

(54) OPTICAL INTERCONNECT MODULES WITH 3D POLYMER WAVEGUIDE

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,043

(22) Filed: Apr. 25, 2018

(65) Prior Publication Data

US 2018/0335584 A1 Nov. 22, 2018

Related U.S. Application Data

(60) Provisional application No. 62/509,892, filed on May 23, 2017, provisional application No. 62/508,940, filed on May 19, 2017.

(51) Int. Cl.
*G02B 6/42* (2006.01)
*H01S 5/183* (2006.01)
(Continued)

(52) U.S. Cl.
CPC ........ *G02B 6/4214* (2013.01); *G02B 6/12011* (2013.01); *G02B 6/1221* (2013.01);
(Continued)

(58) Field of Classification Search
CPC ...... H04B 10/25; H04B 10/506; H04B 10/67; G02B 6/12011; G02B 6/122;
(Continued)

(56) References Cited

U.S. PATENT DOCUMENTS 5,282,080 A 1/1994 Scifres et al.
5,416,861 A 5/1995 Koh et al.
(Continued)

FOREIGN PATENT DOCUMENTS

WO WO 2018/213035 A1 11/2018
WO WO 2018/213036 A1 11/2018
(Continued)

OTHER PUBLICATIONS

Chen et al., "Chip-Level 1 2 Optical Interconnects Using Polymer Vertical Splitter on Silieuri Substrate," IEEE Photonlcs Journal, 6:1-9 (2014).[ Retrieved from the Internet on Jun. 29, 2018 <URL:https://ieeexplore.ieee.org/stamp/stamp.jsp?tp=&arnumber=67.
(Continued)

*Primary Examiner* — Michael P Mooney
(74) *Attorney, Agent, or Firm* — Alston & Bird LLP

(57) ABSTRACT

An optical interconnect structure connecting a VCSEL laser or a photodetector to a fiber cable with a 3D polymer waveguide is described. The waveguide has a vertical portion at one end of a horizontal trench portion joined by a 45 degree sidewall. The vertical portion interfaces with VCSEL laser arranged on a flexible circuit board. The other end of the horizontal trench portion connects to a fiber via a mechanical transport connector. The flexible structure also holds driver, receiver, pad, amplifier, RF chip and transmission lines. A method of fabrication includes: patterning a polymer cladding layer into a horizontal trench and a 45 degree side wall by applying multiple exposure techniques; filling horizontal trench and 45 degree side wall cavity to form a core followed by planarizing the core layer to remove excess core; patterning a vertical cavity aligned with the 45 degree side wall to form a reflector.

10 Claims, 5 Drawing Sheets

(51) Int. Cl.
   *H05K 1/02*    (2006.01)
   *G02B 6/122*   (2006.01)
   *G02B 6/12*    (2006.01)
   *H04B 10/25*   (2013.01)
   *H04B 10/67*   (2013.01)
   *G02B 6/36*    (2006.01)
   *H01S 5/022*   (2006.01)
   *H05K 1/18*    (2006.01)
   *H04B 10/50*   (2013.01)
   *H04J 14/02*   (2006.01)

(52) U.S. Cl.
   CPC ........... *G02B 6/3652* (2013.01); *G02B 6/425* (2013.01); *G02B 6/4206* (2013.01); *G02B 6/428* (2013.01); *G02B 6/4212* (2013.01); *G02B 6/4259* (2013.01); *G02B 6/4279* (2013.01); *H01S 5/183* (2013.01); *H04B 10/25* (2013.01); *H04B 10/67* (2013.01); *H05K 1/0274* (2013.01); *G02B 6/421* (2013.01); *H01S 5/02284* (2013.01); *H01S 5/02292* (2013.01); *H04B 10/506* (2013.01); *H04J 14/02* (2013.01); *H05K 1/189* (2013.01); *H05K 2201/10121* (2013.01); *H05K 2201/10151* (2013.01)

(58) Field of Classification Search
   CPC .. G02B 6/1221; G02B 6/1223; G02B 6/1228; G02B 6/02033; G02B 6/3839; G02B 6/3885; G02B 6/428; G02B 6/3652; G02B 6/4206; G02B 6/421; G02B 6/4212; G02B 6/4214; G02B 6/425; G02B 6/4259; G02B 6/4279; B29L 2011/0066; B29L 2011/0075; H01S 5/02284; H01S 5/02292; H01S 5/183; H04J 14/02; H05K 1/0274; H05K 1/189; H05K 2201/10121; H05K 2201/10151
   USPC .................... 385/14, 31–50, 88–92
   See application file for complete search history.

(56) References Cited

U.S. PATENT DOCUMENTS

| | | | |
|---|---|---|---|
| 5,446,814 A | 8/1995 | Kuo et al. | |
| 5,485,021 A | 1/1996 | Abe | |
| 5,956,603 A | 9/1999 | Talwar et al. | |
| 6,036,956 A | 3/2000 | Jacob et al. | |
| 6,049,639 A | 4/2000 | Paniccia et al. | |
| 6,052,498 A | 4/2000 | Paniccia | |
| 6,243,508 B1 | 6/2001 | Jewell et al. | |
| 6,330,377 B1 | 12/2001 | Kosemura | |
| 6,393,169 B1 | 5/2002 | Paniccia et al. | |
| 6,403,393 B1 | 6/2002 | Adkisson et al. | |
| 6,456,765 B1 | 9/2002 | Klocek et al. | |
| 6,549,708 B2 | 4/2003 | Worchesky et al. | |
| 6,587,605 B2 | 7/2003 | Paniccia et al. | |
| 6,603,915 B2 | 8/2003 | Glebov et al. | |
| 6,731,856 B1 | 5/2004 | Fujita et al. | |
| 6,845,184 B1 | 1/2005 | Yoshimura et al. | |
| 6,996,303 B2 | 2/2006 | Glebov et al. | |
| 7,218,809 B2 | 5/2007 | Zhou et al. | |
| 7,266,262 B2 | 9/2007 | Ogawa | |
| 7,529,439 B2 | 5/2009 | Kim et al. | |
| 7,627,204 B1 | 12/2009 | Deane | |
| 8,135,248 B2 | 3/2012 | Hodono | |
| 8,368,995 B2 | 2/2013 | Dallesasse et al. | |
| 9,036,956 B2 | 5/2015 | Tseng et al. | |
| 9,086,551 B2 | 7/2015 | Heroux | |
| 9,310,575 B2 | 4/2016 | Matsuda | |
| 9,341,797 B2 | 5/2016 | Nakagawa et al. | |
| 9,627,851 B1 | 4/2017 | Zilkie | |
| 9,939,593 B2 | 4/2018 | Miao et al. | |
| 9,964,702 B1 | 5/2018 | Luo et al. | |
| 2001/0031109 A1 | 10/2001 | Paniccia et al. | |
| 2001/0038737 A1 | 11/2001 | Imada et al. | |
| 2002/0018507 A1 | 2/2002 | Deacon | |
| 2002/0028045 A1* | 3/2002 | Yoshimura .............. G02B 6/10 385/50 |
| 2002/0036356 A1 | 3/2002 | Teshima | |
| 2002/0114587 A1 | 8/2002 | Golwalkar et al. | |
| 2003/0015770 A1 | 1/2003 | Talin et al. | |
| 2003/0223673 A1 | 12/2003 | Garito et al. | |
| 2004/0065843 A1 | 4/2004 | Schut et al. | |
| 2004/0109654 A1 | 6/2004 | Feger et al. | |
| 2004/0245538 A1 | 12/2004 | Wang et al. | |
| 2004/0264837 A1 | 12/2004 | Ogawa | |
| 2005/0031265 A1 | 2/2005 | Simon et al. | |
| 2005/0041906 A1 | 2/2005 | Sugama et al. | |
| 2005/0063636 A1 | 3/2005 | Joyner | |
| 2005/0136574 A1 | 6/2005 | Shih et al. | |
| 2005/0141808 A1 | 6/2005 | Cheben et al. | |
| 2005/0185900 A1 | 8/2005 | Farr | |
| 2005/0201707 A1 | 9/2005 | Glebov | |
| 2006/0045418 A1 | 3/2006 | Cho et al. | |
| 2007/0058976 A1 | 3/2007 | Tatum et al. | |
| 2008/0031583 A1* | 2/2008 | Ohtsu ..................... G02B 6/10 385/130 |
| 2008/0037934 A1 | 2/2008 | Daikuhara et al. | |
| 2008/0130125 A1 | 6/2008 | Goelles et al. | |
| 2008/0265416 A1 | 10/2008 | Lee et al. | |
| 2008/0279557 A1 | 11/2008 | Park et al. | |
| 2008/0279566 A1 | 11/2008 | Miller et al. | |
| 2009/0049964 A1 | 2/2009 | Yagyu et al. | |
| 2009/0060526 A1 | 3/2009 | Matsui et al. | |
| 2009/0072393 A1 | 3/2009 | Bachman | |
| 2009/0202713 A1 | 8/2009 | Pitwon | |
| 2009/0218519 A1 | 9/2009 | McLeod | |
| 2010/0032853 A1 | 2/2010 | Naitou | |
| 2010/0104290 A1 | 4/2010 | Nobuhara et al. | |
| 2010/0213561 A1 | 8/2010 | Assefa et al. | |
| 2010/0215313 A1 | 8/2010 | Matsuoka et al. | |
| 2010/0226655 A1 | 9/2010 | Kim | |
| 2011/0030778 A1 | 2/2011 | Takacs et al. | |
| 2011/0133063 A1 | 6/2011 | Ji et al. | |
| 2011/0229080 A1 | 9/2011 | Bulthuis et al. | |
| 2012/0076454 A1 | 3/2012 | Shiraishi | |
| 2012/0163821 A1 | 6/2012 | Kwon et al. | |
| 2012/0177381 A1 | 7/2012 | Dobbelaere | |
| 2012/0314990 A1 | 12/2012 | Pitwon et al. | |
| 2013/0064494 A1 | 3/2013 | Bolle et al. | |
| 2013/0182998 A1 | 6/2013 | Andry et al. | |
| 2013/0195456 A1 | 8/2013 | Sorin et al. | |
| 2013/0223789 A1 | 8/2013 | Lee | |
| 2014/0112616 A1 | 4/2014 | Numata | |
| 2014/0140657 A1 | 5/2014 | Shiraishi | |
| 2014/0177995 A1 | 6/2014 | Mohammed et al. | |
| 2014/0294342 A1 | 10/2014 | Offrein | |
| 2014/0321804 A1 | 10/2014 | Thacker et al. | |
| 2014/0355931 A1 | 12/2014 | Tummala et al. | |
| 2015/0043919 A1 | 2/2015 | Handelman | |
| 2015/0117824 A1 | 4/2015 | Wang et al. | |
| 2015/0132002 A1 | 5/2015 | Krishnamurthy et al. | |
| 2015/0168646 A1 | 6/2015 | Arai | |
| 2015/0303649 A1 | 10/2015 | Weber | |
| 2015/0333831 A1 | 11/2015 | Lai et al. | |
| 2015/0362673 A1 | 12/2015 | Zheng et al. | |
| 2015/0362676 A1 | 12/2015 | Murison et al. | |
| 2016/0011414 A1 | 1/2016 | Joseph | |
| 2016/0156999 A1 | 6/2016 | Liboiron-Ladouceur et al. | |
| 2016/0178839 A1 | 6/2016 | Tsujita | |
| 2016/0349451 A1 | 12/2016 | Shen et al. | |
| 2017/0017042 A1 | 1/2017 | Menard et al. | |
| 2017/0230117 A1 | 8/2017 | Li et al. | |
| 2018/0149815 A1 | 5/2018 | Heroux et al. | |
| 2018/0159627 A1 | 6/2018 | Fazal et al. | |
| 2018/0288875 A1 | 10/2018 | Sasaki et al. | |
| 2018/0335583 A1 | 11/2018 | Jou et al. | |
| 2018/0335585 A1 | 11/2018 | Jou et al. | |
| 2018/0335586 A1 | 11/2018 | Jou et al. | |
| 2018/0335587 A1 | 11/2018 | Jou et al. | |
| 2018/0335588 A1 | 11/2018 | Jou et al. | |

(56) References Cited

U.S. PATENT DOCUMENTS

2018/0335589 A1 11/2018 Jou et al.
2018/0335590 A1 11/2018 Jou et al.
2018/0337111 A1 11/2018 Jou et al.
2018/0337743 A1 11/2018 Jou et al.

FOREIGN PATENT DOCUMENTS

| WO | WO 2018/213037 A1 | 11/2018 |
| WO | WO 2018/213038 A1 | 11/2018 |
| WO | WO 2018/213039 A1 | 11/2018 |
| WO | WO 2018/213040 A1 | 11/2018 |
| WO | WO 2018/213041 A1 | 11/2018 |
| WO | WO 2018/213042 A1 | 11/2018 |
| WO | WO 2018/213043 A1 | 11/2018 |
| WO | WO 2018/213044 A1 | 11/2018 |

OTHER PUBLICATIONS

Shen et al., "Implementation of Chip-Level Optical Interconnect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.Ieee.org/abstract/docu.
U.S. Appl. No. 15/963,440 Requirement for Restriction-Election dated Jul. 10, 2018.
U.S. Appl. No. 15/963,780, Requirement for Restriction-Election dated Jul. 27, 2018.
U.S. Appl. No. 15/964,889, Non-Final Office Action dated Jun. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031335, PCT International Search Report and Written Opinion of the International Searching Authority dated Sep. 12, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.
Vlasov "Silicon CMOS-Integrated Nano-Photonics for Computer and Data Communications Beyond 100G," IEEE Communications Magazine, 50(2):s67-s72, (2012).
U.S. Appl. No. 15/963,440, Non-Final Office Action dated Dec. 19, 2018.
U.S. Appl. No. 15/963,780, Non-Final Office Action dated Oct. 24, 2018.
U.S. Appl. No. 15/964,889, Final Office Action dated Jan. 2, 2019.
U.S. Appl. No. 15/965,213, Non-Final Office Action dated Jan. 14, 2019.
U.S. Appl. No. 15/963,030, Non-Final Office Action dated Oct. 17, 2018.
U.S. Appl. No. 15/963,665, Notice of Allowance dated Oct. 3, 2018.
U.S. Appl. No. 15/963,030, Non-Final Office Action dated Oct. 17, 2017.
U.S. Appl. No. 15/964,701, Non-Final Office Action dated Oct. 5, 2018.
WIPO Application No. PCT/US2018/031336, PCT International Search Report and Written Opinion of the International Searching Authority dated Sep. 19, 2018.
U.S. Appl. No. 15/964,889, Notice of Allowance dated Mar. 21, 2019.
U.S. Appl. No. 15/963,014, Non-Final Office Action dated Mar. 29, 2019.
U.S. Appl. No. 15/963,014, Notice of Allowance dated Jul. 2, 2019.
U.S. Appl. No. 15/963,030, Final Office Action dated May 15, 2019.
U.S. Appl. No. 15/963,030, Notice of Allowance dated Jul. 16, 2019.
U.S. Appl. No. 15/963,440, Final Office Action dated Apr. 23, 2019.
U.S. Appl. No. 15/963,440, Non-Final Office Action dated Jun. 6, 2019.
U.S. Appl. No. 15/963,780, Non-Final Office Action dated Apr. 25, 2019.
U.S. Appl. No. 15/963,780, Notice of Allowance dated Sep. 17, 2019.
U.S. Appl. No. 15/963,815, Non-Final Office Action dated Jun. 17, 2019.
U.S. Appl. No. 15/964,701, Final Office Action dated May 2, 2019.
U.S. Appl. No. 15/964,701, Non-Final Office Action dated Jun. 14, 2019.
U.S. Appl. No. 15/965,213, Notice of Allowance dated Jun. 5, 2019.
U.S. Appl. No. 15/963,440, Final Office Action dated Oct. 3, 2019.
U.S. Appl. No. 15/963,815, Final Office Action dated Oct. 7, 2019.
U.S. Appl. No. 15/963,815, Notice of Allowance dated Oct. 29, 2019.

* cited by examiner

OPTICAL INTERCONNECT MODULES WITH 3D POLYMER WAVEGUIDE

CROSS REFERENCE TO RELATED APPLICATIONS

This application claims the benefit of U.S. Provisional Patent Applications No. 62/508,940, titled "OPTICAL COUPLING STRUCTURE" filed May 19, 2017, and No. 62/509,892, titled "OPTICAL INTERCONNECT MODULES" filed May 23, 2017, which are incorporated by reference herein in their entirety.

FIELD

Embodiments described herein relate to optical interconnect modules, and more particularly to interconnects with polymer waveguides.

BACKGROUND

Cloud computing, enterprise networks, and data center networks continue to drive increased bandwidth demand of optical waveguides for metro and long haul wires, and rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a variety of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module incudes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, prism, and fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves lens alignment, adding complexity and energy loss. A less complicated assembly technique is needed to improve efficiency and reduce cost.

SUMMARY

An optical interconnect structure connecting a VCSEL laser to a multi-mode fiber ribbon cable with a 3D polymer waveguide is disclosed. In one embodiment in accordance with the disclosure, an optical interconnect apparatus comprises: an optical polymer waveguide extending in a first direction, including: a first core structure parallel to the first direction, a second core structure perpendicular to the first core structure, and a third core structure connects the first and second core structures like an elbow, which forms a surface having a 45 degree angle with the first direction; and a cladding structure surrounding the first core structure and the second core structure; the cladding structure comprises a first cladding layer comprising of a first polymer cladding material on one side of the first core structure and a second cladding layer comprising of a second polymer cladding material on another side of the first core structure; a flexible circuit structure arranged on the surface of the optical polymer waveguide; an active optical device, mounted on the flexible circuit structure, forms optical path with the second core structure; and an optical fiber cable forms optical path with the first core structure at a far end.

In one embodiment in accordance with the disclosure, the first, second and third core structures are made of a polymer core material and the cladding structure is made of a first and a second polymer cladding materials, the refractive index of the polymer core material is larger than a refractive index of the polymer cladding materials thereby providing total internal reflection along optical path.

In one embodiment in accordance with the disclosure, the active optical device is a vertical cavity surface emission laser (VCSEL) or a photo-detector.

In one embodiment in accordance with the disclosure, the cladding structure surrounds the 45 degree surface of the third core structure.

In one embodiment in accordance with the disclosure, the 45 degree surface of the third core structure is surrounded by air.

In another embodiment in accordance with the disclosure, a method of fabricating an optical polymer waveguide is disclosed, which comprises: providing a temporary substrate as a support; depositing a first polymer cladding layer on the temporary substrate; patterning the first polymer cladding layer into a horizontal trench and a 45 degree sloped side wall by applying multiple exposure techniques; depositing a first core layer on the first cladding layer and filling it into the horizontal trench and on the 45 degree side wall; planarizing the first core layer to remove excess first core layer from the top surface of the first polymer cladding layer; depositing a second cladding layer; patterning the second cladding layer to form a vertical cavity aligned with the 45 degree side wall; depositing a second core layer and filling the vertical cavity; planarizing the second core layer to remove excess of the second core layer from the second cladding layer; and removing the temporary substrate.

BRIEF DESCRIPTION OF THE DRAWINGS

Having thus described some embodiments in general terms, reference will now be made to the accompanying drawings, which are not necessarily drawn to scale.

Figure 1:
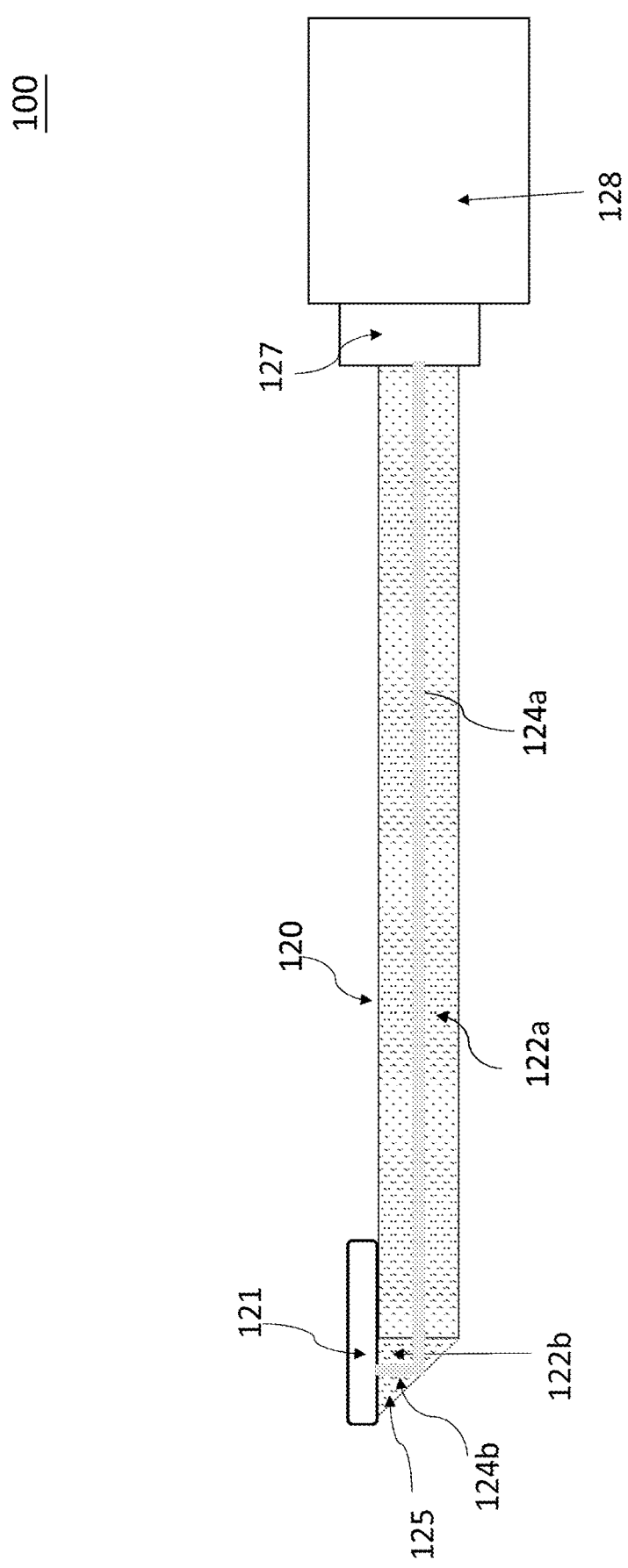

FIG. 1 includes a cross-sectional side view illustration of a flexible printed circuit (FPC)-based optical interconnect with a 3D polymer waveguide in accordance with an embodiment.

Figure 2:
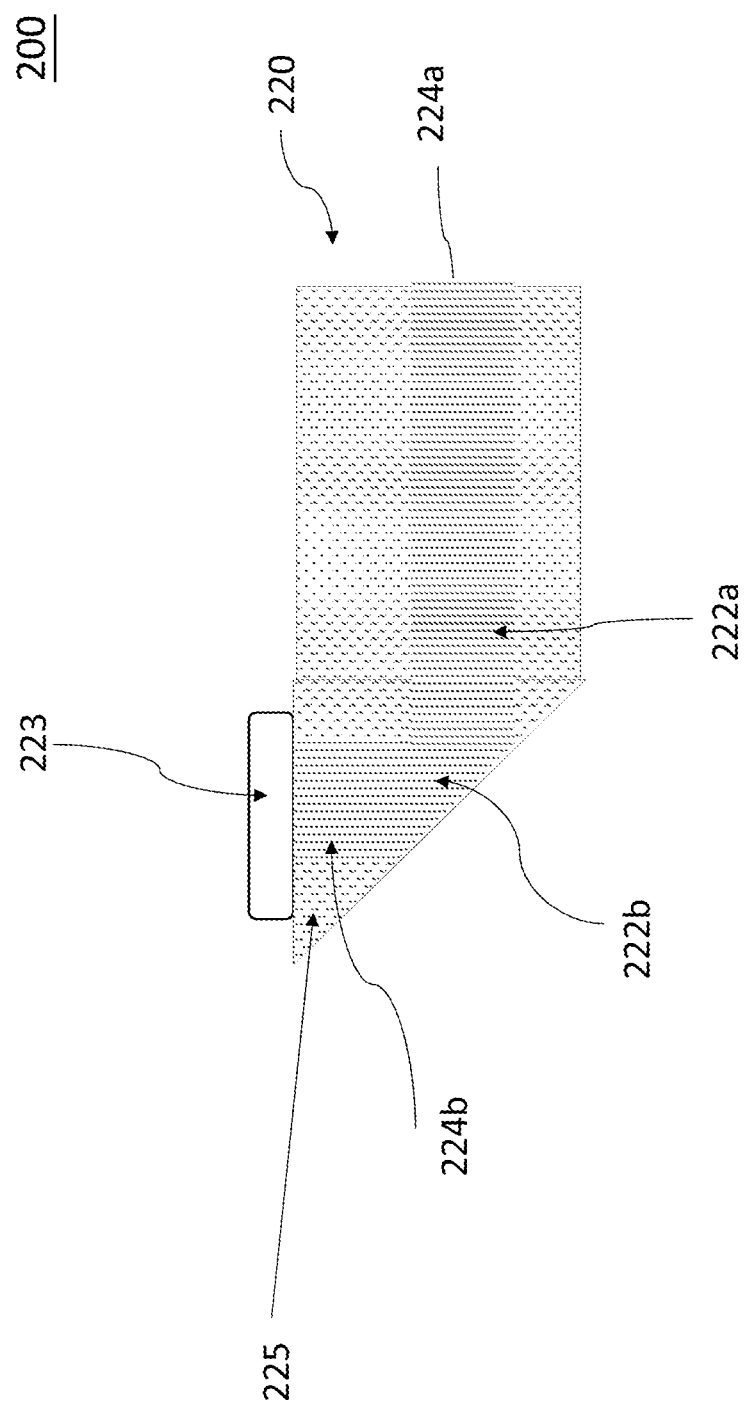

FIG. 2 is a close-up cross-sectional side view illustration of an optical interconnect with a 3D polymer waveguide in accordance with an embodiment.

Figure 3:
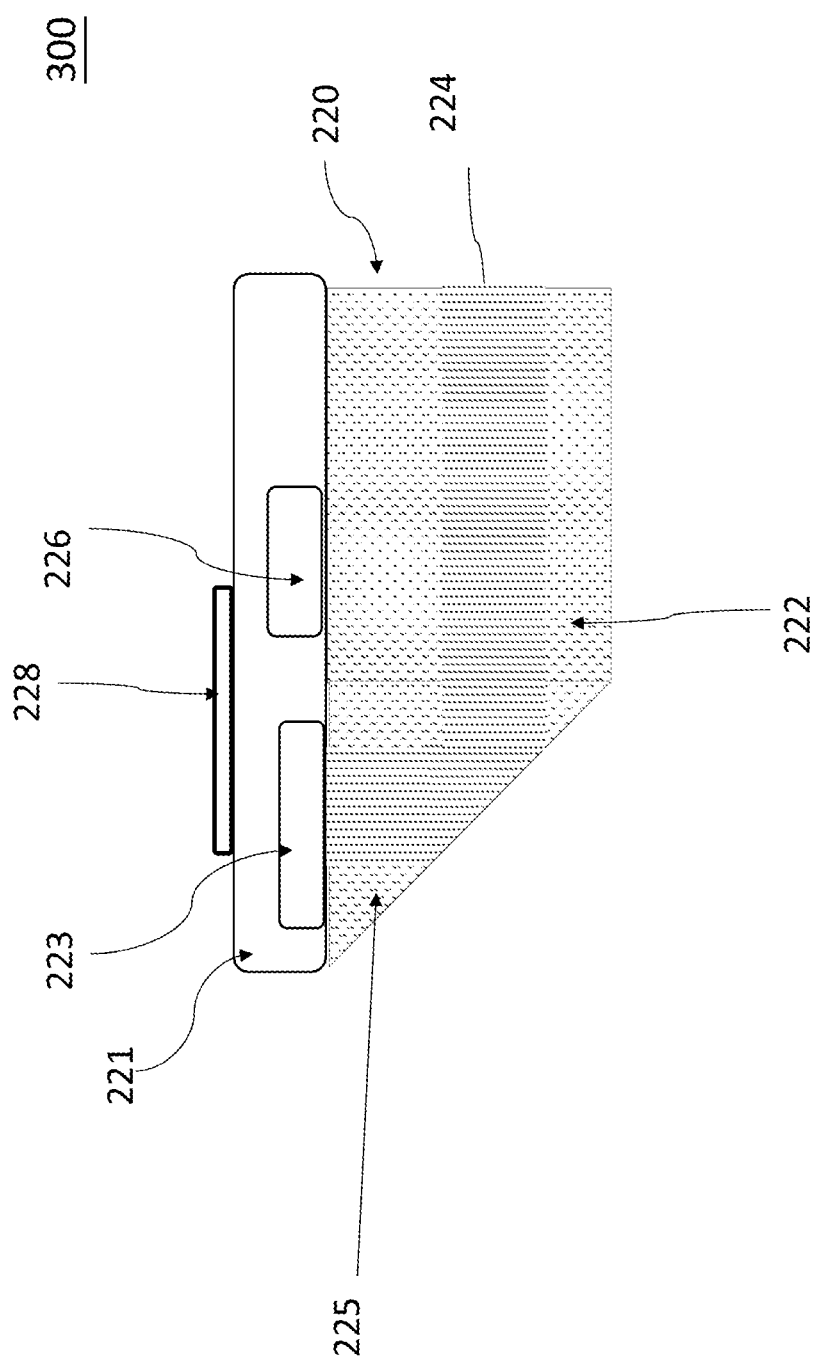

FIG. 3 is a close-up cross-sectional side view illustration of an on-chip optical interconnect with a 3D polymer waveguide in accordance with an embodiment.

Figure 4:
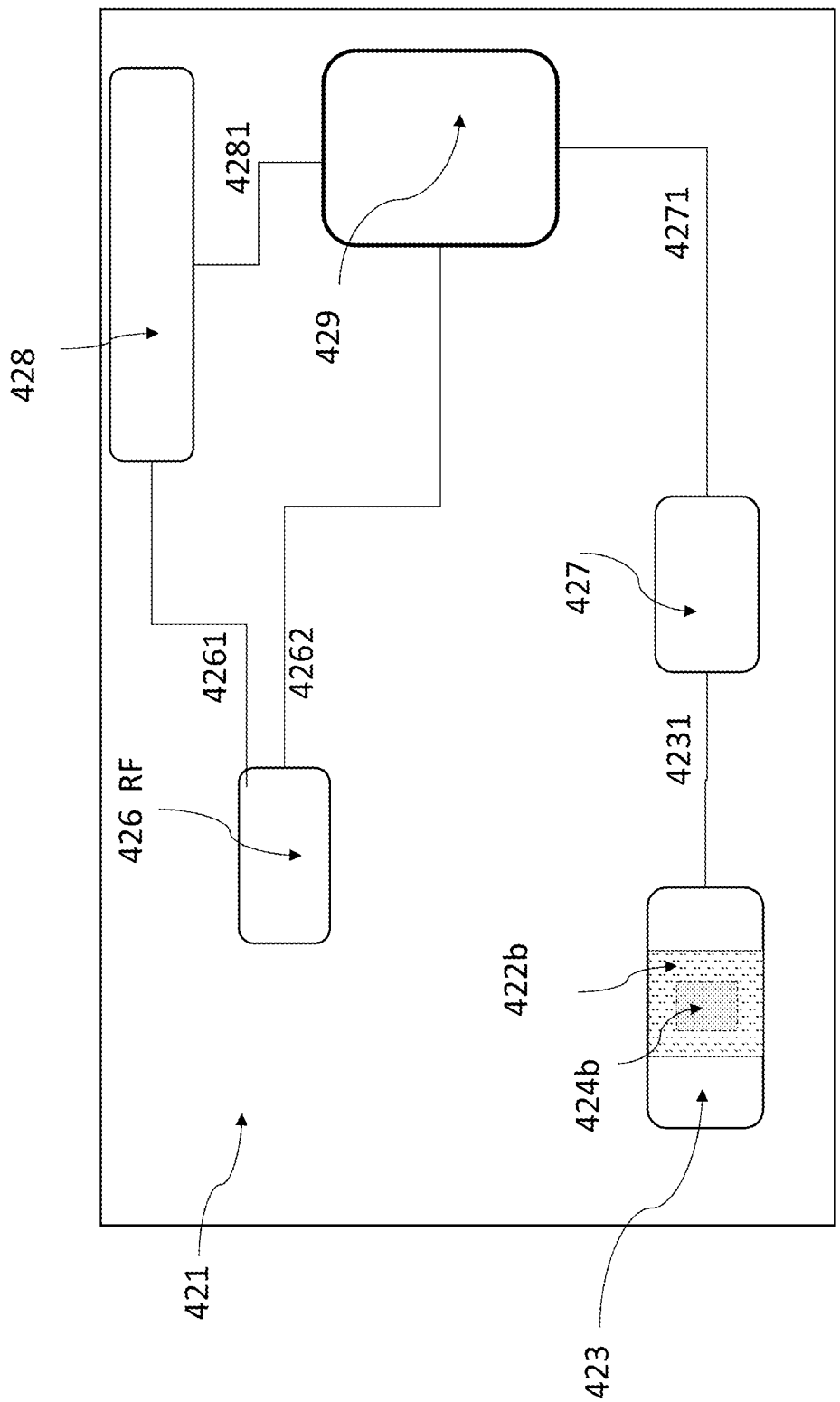

FIG. 4 is a schematic diagram illustration of a chip circuitry area for an optical interconnect with a 3D polymer waveguide in accordance with an embodiment.

Figure 5:
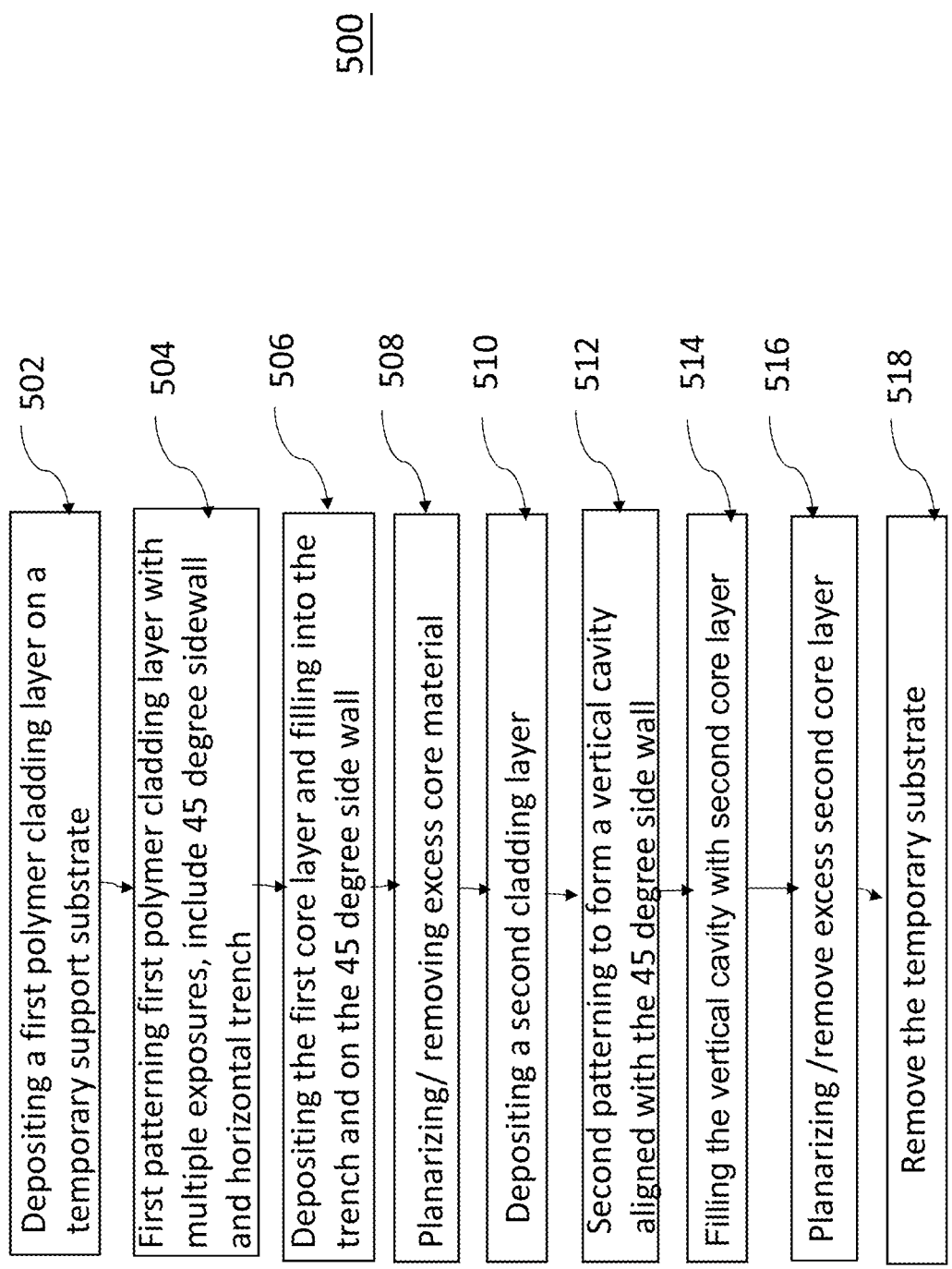

FIG. 5 is a schematic diagram illustrating a fabrication method for making an optical interconnect with a 3D polymer waveguide in accordance with an embodiment.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

Optical interconnect is a means of communication by optical fiber cables. Compared to traditional cables, optical fibers are capable of a much higher bandwidth, from 10 Gbit/s up to 100 Gbit/s. (is this number correct?)

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. In addition, assembly time can be reduced compared to conventional techniques through use of semiconductor process technologies for the formation of transmission lines and flip chip integration of the active devices such as the driver IC chip, laser, PD, and receiver (e.g. TIA) chip. In addition, the fabrication techniques may allow for improved RF performance of the electrical signals and increased data rates of the optical interconnects. The embodiments illustrated below may be integrated as an optical interconnect incorporating a FPC. (is this correct?) interconnect In particular, the embodiment may be utilized to improve optical coupling with the VCSEL/PD by monolithically integrating a 3D polymer waveguide within a FPC. The polymer-based 3D optical waveguides terminated with 45 degree reflectors may be adopted to simplify the optical configuration of the module without fiber assembly and lens alignment.

In an embodiment, a multi-channel 3D polymer optical waveguide includes vertically-bending cores close to 45 degree reflectors. Such a configuration may allow the optical paths to transmit optical signals from the VCSELs to fiber arrays as well as to receive optical signals from the fiber arrays to PD arrays.

Referring now to FIG. 1, a cross-sectional side view illustration of a flexible printed circuit (FPC)-based optical interconnect with a multiple 3D polymer optical waveguide in accordance with an embodiment. An optical interconnector 100 such as that illustrated in FIG. 1 includes an optical waveguide 120 which has an edge (e.g. 45 degrees) on the core layer shown as a vertical bending part 125. The 3D optical waveguide 120 may include a horizontal cladding layer 122a and a 3D vertical cladding layer 122b, a horizontal core layer 124a surrounded by the horizontal cladding layer 122a, and a vertical core layer 124b surrounded by the vertical cladding layer 122b. The cladding layer above (sometimes referred to as under cladding because it is an internal cladding) and the cladding layer below the straight waveguide (sometimes referred to as over cladding because it is an external cladding) can be made of different materials. The horizontal and vertical cladding layers can also be made of different materials. The optical interconnect 100 may also include a flexible chip circuit board active optical device VCSEL or PD mounted on an chip circuitry substrate 121 directly over the 3D vertical bending part 125. A far end of the 3D optical waveguide may be coupled to a multi-fiber mechanical transfer connector (MT) 127, and a ribbon fiber cable 128.

In accordance with embodiments, multi-channel polymer waveguides terminated with 45 degree reflectors are designed as optical paths to transmit optical signals from the vertical cavity surface emitting lasers (VCSELs) 121 to fiber arrays 128, as well as to receive optical signals from fiber arrays to photodiode (PD) arrays. The polymer-based optical waveguide terminated with 45 degree reflectors may simplify the optical configuration of the module without fiber assembly. FIG. 1 illustrates such a connector 127 to the fiber arrays. In a specific embodiment, the multi-channel polymer waveguides are terminated with a multi-channel mechanical transfer (MT) connector 127, also referred to as a polymer mechanical transport (PMT) connector when connected with a polymer waveguide, to link with a fiber ribbon cable. Thus, the optical interconnects may be considered flexible printed circuit (FPC)-based.

In a close-up cross-sectional side view illustration as in FIG. 2 in accordance with an embodiment, the optical interconnect module 200 includes the vertical bending part 225 which has a 45 degree sloped edge mirror at one end of the optical polymer waveguide 220 along the core layer 224a and the horizontal cladding layer 222a. In addition to the horizontal cladding layer 222a and a horizontal core layer 224a, there are also a vertical cladding layer 222b, and a vertical core layer 224b, both are monolithically fabricated respectively for efficient coupling through the polymer waveguide. Horizontal cladding layer 222a and vertical cladder layer 222b can be made of different materials. The core structure inside the vertical bending part 225 has a 45 degree sloped edge in contact with cladding, or air or another media with lower refractive index than that of the polymer core material. The outer interface surface is finely etched, maybe by a laser, to form a high reflective mirror. The FPC based electrical circuitry 223 is placed over the vertical core 224b, it may include an active optical device VCSEL, driver IC, or photodiode PD, TIAIC, depending on the interconnect applications.

As shown in FIG. 3, additional electronics like a IC driver, trans-impedance amplifier (TIA) chip 226, electrical traces (transmission lines) and solder bumps on bond pad 228 are formed on the FPC board next to the active device 223, for example, VCSEL/PD, placed over the top surface of the front end of the 3D waveguide.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on gallium arsenide (GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a polyimide layer or a non-conductive film (NCF), may also be applied to enhance adhesion of the components. The high speed electrical traces, including the RF devices 226, are designed on the waveguide surface to connect the driver IC and VCSEL arrays as well as to connect trans-impedance amplifier (TIA) arrays. Typically a VCSEL array has four VCSEL lasers integrated in a row.

In accordance with an embodiment, the data rate of the optical engine can be operated at 25 Giga-bits per second (Gbps) per channel, and can be extended to higher data rates such as 50 Gbps per channel. VCSEL applications include fiber optic communications, precision sensing, computer mice and laser printers. Recent developments of tunable VCSELs with micromechanically (MEMS) movable mirrors have expanded their applications in particular into tunable.

FIG. 4 is a schematic diagram illustration of a FPC-based circuitry system 400 for an optical interconnect with the 3D polymer waveguide of FIGS. 1-3 in accordance with an embodiment.

The circuitry system 421 includes: one or more VCSELs or one or more PDs (in case of a receiver) 423, a VCSEL driver chip or a PD receiver (e.g. TIA) chip 427, a controller 429, a RF chip 426, and their connections (e.g. flip chip) to the pads 428 through the electric transmission lines such as 4231, 4261, 4262, 4271, and 4281. There is an insulating layer covering the board 400 (not shown). The insulation layer can be made of organic materials such as polyimide. The patterns of high-speed electric transmission lines, bond pads, and solder bumps are then formed on the insulation layer. The laser VCSEL 423 is mounted over the vertical cladding area 422b and vertical core area 424b of the polymer waveguide that is directly over a 45 degree slanted edge. The VCSEL emission surface is aligned and interfaced with the top surface of the vertical core 424b.

In case a photodetector is needed at the other end of the polymer waveguide, the photodetector may be mounted directly over another 45 degree slanted edge of the waveguide similarly constructed as the front end, the second FPC-based electronic circuitry board is not included in the figures because of its similarity as the system in FIG. 4.

Also referring to FIG. 4, the transmission lines, bond pads, and solder bumps may then be fabricated on a front side of the polymer waveguide using semiconductor fabrication techniques such as lithography and etch techniques. Additionally, the active devices may be flip chip bonded and assembled onto the transmission lines on the front side of the vertical part of the polymer waveguide. For example, a particular arrangement includes 1×4 VCSEL/PD 423, driver IC 427, and TIA arrays (not shown here) to form the optical interconnect system FIG. 5 is a schematic diagram illustrating a fabrication method for making an optical interconnect with a 3D polymer waveguide in accordance with an embodiment.

The fabrication sequence may include first step 502, depositing a first polymer cladding layer on a temporary substrate, using a suitable technique such as spin coating or spray coating. In a first patterning process 504, horizontal trenches along the axis of the polymer waveguide are wet/dry etched into the first polymer cladding layer. In accordance with embodiments, the horizontal trench may optionally include a sloped 45 degree sidewall, such that the trench opening that will be closest to the VCSEL/PD is larger than the opening that connects with the core trench layer. The 45 degree sidewalls will be used as the 45 degree reflectors. Another way of forming the 45 degree sidewall can be achieved by having multiple lithographic exposures on the sidewall side in a separate step from forming the horizontal trench in the last step. The two exposures apply two masks separately at the horizontal trench area and the 45 degree sidewall area. In the making of the slanted sidewalls, multiple exposures with varying mask openings can be applied. In the next step 506, the polymer core layer is then deposited on the first cladding layer, filling the horizontal trenches and the 45 degree sidewalls cavities, followed by step 508, removing the excess core material outside the core trenches and cavities using a planarization technique such as the chemical mechanical polishing (CMP) or a selective wet/dry etch. In the next step 510 the second cladding layer is deposited over the planarized surface. A second patterning process 512 in the second cladding layer is performed to form a vertical cavity aligned with each 45 degree side wall reflector to form an optical path with the horizontal waveguide. The next step 514, filling the vertical cavity with core material. Another planarization process 516 is then applied to remove the excess core material outside the vertical cavities and provide a flat and clean surface to be the interface between the vertical waveguide and the active optical device exit plane. Like in the previous removal step 508, a planarization technique such as the chemical mechanical polishing (CMP) or a selective wet/dry etch can be applied to flatten the surface and remove excess core material. When the waveguides are fabricated, perform step 518 to disengage the temporary substrate if necessary. The temporary substrate can be a silicon wafer, a glass plate, or another form-factor which provides support during process. However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. An optical interconnect apparatus, comprising:
a flexible substrate;
an optical polymer waveguide disposed on a surface of the flexible substrate, wherein the optical polymer waveguide comprises:
a first core structure extending along a first direction and having a first end and a second end;

a second core structure positioned with one end on the flexible substrate and another end near the first end of the first core structure, wherein the second core structure is arranged with its optical axis perpendicular to both the surface of the flexible substrate and the first core structure;

a third core structure is configured to connect with the first and second core structures like an elbow, wherein the third core structure comprises a slanted surface at 45 degrees from the first direction to bend light traveling between the first and the second core structures;

a cladding structure surrounding the first core structure and the second core structure, wherein the cladding structure comprises a first cladding layer having a first polymer cladding material on one side of the first core structure and a second cladding layer comprising a second polymer cladding material on another side of the first core structure;

an active optical device mounted on another surface of the flexible substrate, and an optical fiber cable configured to connect with the second end of the first core structure;

wherein an optical path of the optical interconnect apparatus includes the active optical device, the flexible substrate, the second core structure, the third core structure, the first core structure and the optical fiber cable; and wherein the first, second and third core structures are made of a polymer core material and the first polymer cladding material and the second polymer cladding material are different.

2. The optical interconnect apparatus of claim 1, wherein a refractive index of the polymer core material is larger than both refractive indexes of the first and second polymer cladding materials to provide for optical wave a total internal reflection along the optical path, and wherein the cladding structure further surrounds the slanted surface of the third core structure.

3. The optical interconnect apparatus of claim 1, wherein the active optical device is a vertical cavity surface emission laser (VCSEL) or a photo-detector (PD).

4. The optical interconnect apparatus of claim 1, wherein the slanted surface of the third core structure is surrounded by air.

5. The optical interconnect apparatus of claim 1, wherein the slanted surface of the third core structure is surrounded by a liquid.

6. The optical interconnect apparatus of claim 1, wherein the optical polymer waveguide is a multi-mode waveguide.

7. The optical interconnect apparatus of claim 1, wherein the polymer waveguide connects with the optical fiber cable via a mechanical transport (MT) connector.

8. The optical interconnect apparatus of claim 7, wherein the optical fiber cable is a multi-fiber ribbon and wherein the mechanical transport (MT) connector is a multi-fiber mechanical transport (MT) connector.

9. The optical interconnect apparatus of claim 1, wherein the other surface of the flexible substrate further comprises a driver IC for the optical active device, a receiver chip, a RF transmission device, a control chip, a pad, and a plurality of transmission lines.

10. The optical interconnect apparatus of claim 1, wherein the active optical device is a VCSEL array having a plurality of VCSEL emitting areas.

* * * * *